United States Patent
Kim et al.

(10) Patent No.: US 11,309,477 B2
(45) Date of Patent: Apr. 19, 2022

(54) THERMOELECTRIC MODULE

(71) Applicant: LG CHEM, LTD., Seoul (KR)

(72) Inventors: Su Jin Kim, Daejeon (KR); Il Ha Lee, Daejeon (KR); Pum Suk Park, Daejeon (KR); Hyungju Oh, Daejeon (KR); Dong Sik Kim, Daejeon (KR); Byung Kyu Lim, Daejeon (KR); Ki Hwan Kim, Daejeon (KR); Cheol Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/474,266

(22) PCT Filed: Dec. 26, 2017

(86) PCT No.: PCT/KR2017/015484
§ 371 (c)(1),
(2) Date: Jun. 27, 2019

(87) PCT Pub. No.: WO2018/182139
PCT Pub. Date: Oct. 4, 2018

(65) Prior Publication Data
US 2020/0127185 A1 Apr. 23, 2020

(30) Foreign Application Priority Data
Mar. 30, 2017 (KR) .................. 10-2017-0040553

(51) Int. Cl.
*H01L 35/20* (2006.01)
*H01L 35/08* (2006.01)
(Continued)

(52) U.S. Cl.
CPC .............. *H01L 35/20* (2013.01); *H01L 35/08* (2013.01); *H01L 35/10* (2013.01); *H01L 35/34* (2013.01)

(58) Field of Classification Search
CPC ......... H01L 35/20; H01L 35/10; H01L 35/08; H01L 35/34; H01L 35/22; H01L 2924/0133
See application file for complete search history.

(56) References Cited

U.S. PATENT DOCUMENTS

2006/0017170 A1* 1/2006 Chen ..................... H01L 35/34
257/763
2006/0118159 A1* 6/2006 Tsuneoka ............... H01L 35/32
136/211
(Continued)

FOREIGN PATENT DOCUMENTS

JP 2001-028462 A 1/2001
JP 2001028462 A * 1/2001
(Continued)

OTHER PUBLICATIONS

JP2001-028462A, Machine Translation Hoshi (Year: 2001).*
(Continued)

*Primary Examiner* — Devina Pillay
(74) *Attorney, Agent, or Firm* — Birch, Stewart, Kolasch & Birch, LLP

(57) ABSTRACT

A thermoelectric module including at least a first and a second thermoelectric element comprising a thermoelectric semiconductor; an electrode connecting the first and second thermoelectric elements; and at least a first and a second joining layer, the first joining layer positioned between the first thermoelectric element and the electrode, and the second joining layer positioned between the second thermoelectric element and the electrode; and at least a first and a second barrier layer including an alloy including Cu, Mo and Ti, the first barrier layer positioned between the first thermoelectric element and the first joining layer, and the second barrier layer positioned between the second thermoelectric element and the second joining layer. The module prevents
(Continued)

heat diffusion of the material of the joining layer, preventing the oxidation and deformation of the thermoelectric element under high temperature environment, and exhibiting improved operational stability due to excellent adhesion to a thermoelectric element.

6 Claims, 1 Drawing Sheet

(51) Int. Cl.
*H01L 35/10* (2006.01)
*H01L 35/34* (2006.01)

(56) References Cited

U.S. PATENT DOCUMENTS

| | | | |
|---|---|---|---|
| 2010/0167444 A1* | 7/2010 | Chen | H01L 35/32 |
| | | | 438/54 |
| 2012/0180842 A1 | 7/2012 | Chen et al. | |
| 2013/0032189 A1 | 2/2013 | Moczygemba et al. | |
| 2014/0109948 A1 | 4/2014 | Lee et al. | |
| 2014/0137917 A1* | 5/2014 | Al-Merbati | H01L 35/16 |
| | | | 136/205 |
| 2014/0305482 A1 | 10/2014 | Tohei et al. | |
| 2016/0172569 A1 | 6/2016 | Fujimoto et al. | |

FOREIGN PATENT DOCUMENTS

| | | |
|---|---|---|
| JP | 2003-92435 A | 3/2003 |
| JP | 2008-010612 A | 1/2008 |
| JP | 2012-522380 A | 9/2012 |
| JP | 2014-086623 A | 5/2014 |
| JP | 2015-050272 A | 3/2016 |
| KR | 10-2016-0126668 A | 11/2016 |
| KR | 10-2017-0040663 A | 4/2017 |

OTHER PUBLICATIONS

Fan, Fabrication and reliability evaluation ofYb0.3Co4Sb12/Mo—Ti/Mo—Cu/Ni thermoelectric joints, Ceramic International, 41 (2015) pp. 7590-7595 (Year: 2015).*
International Search Report for PCT/KR2017/015484 (PCT/ISA/210) dated Apr. 11, 2018, with English translation.
European Search Report for Appl. No. 17902881.6 dated Nov. 18, 2019.
Fan, X.C., et al, "Fabrication and reliability evaluation of Yb0.3Co4Sb12/Mo—Ti/Mo—Cu/Ni thermoelectric joints," Ceramics International, Jul. 1, 2015, vol. 41, No. 6, pp. 7590-7595.

* cited by examiner

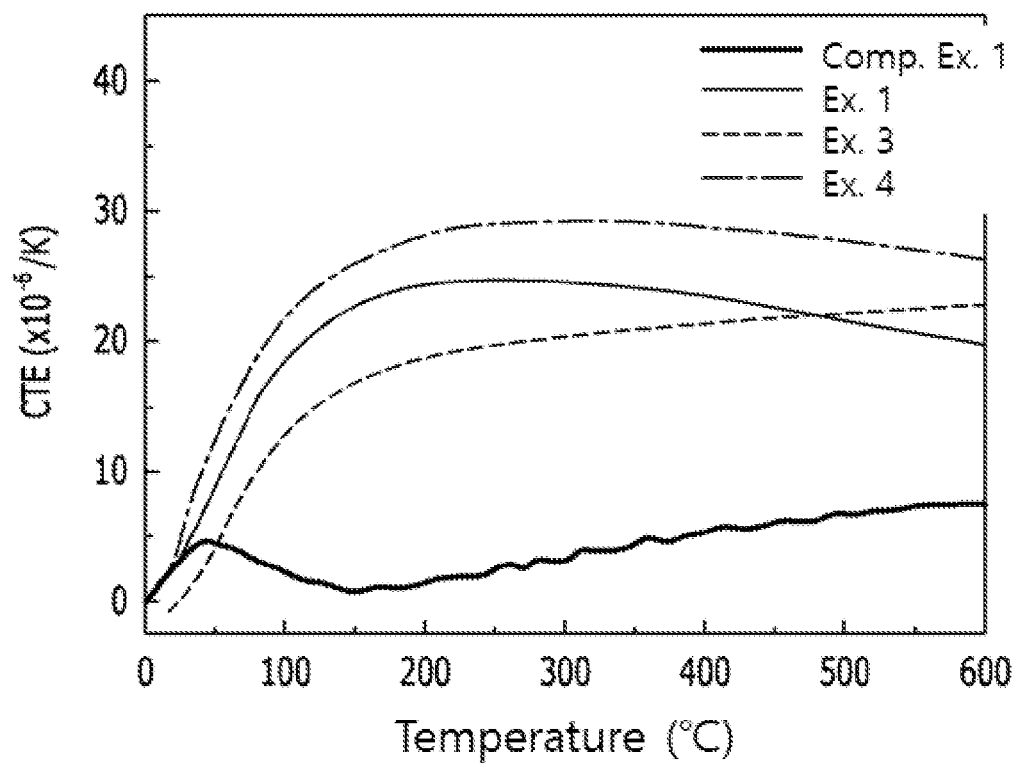

THERMOELECTRIC MODULE

CROSS-REFERENCE TO RELATED APPLICATION(S)

This application claims the benefit of Korean Patent Application No. 10-2017-0040553 filed on Mar. 30, 2017 with the Korean Intellectual Property Office, the disclosures of which are herein incorporated by reference in their entirety.

TECHNICAL FIELD

The present invention provides a thermoelectric module in which heat diffusion of the material of a joining layer is prevented, the oxidation and deformation of a thermoelectric element under high temperature environment is prevented, and improved operational stability is exhibited due to excellent adhesion to a thermoelectric element.

BACKGROUND ART

If there is a temperature difference between both ends of solid material, a difference in the concentration of heat-dependent carriers (electrons or holes) is generated, which is exhibited as an electrical phenomenon of thermoelectric power, namely, a thermoelectric effect. The thermoelectric effect means reversible and direct energy conversion between temperature difference and electricity and voltage. Such a thermoelectric effect may be divided into thermoelectric generation that generates electric energy, and thermoelectric cooling/heating that induces temperature difference of both ends by the supply of electricity, to the contrary.

Thermoelectric material exhibiting a thermoelectric effect, i.e., thermoelectric semiconductor has advantages in that it is environmentally-friendly and is sustainable in the processes of generation and cooling, and thus, a lot of studies thereon are being progressed. Furthermore, it can directly produce electric powder in industrial waste heat, automobile waste heat, etc., and is useful for improvement in fuel efficiency and $CO_2$ reduction, etc., and thus, there is increasing attentions on the thermoelectric material.

The basic unit of the thermoelectric module is one pair of p-n thermoelectric elements consisting of a p-type thermoelectric element (TE) that transfers heat energy by the movement of holes, and an n-type thermoelectric element that transfers heat energy by the movement of electrons. And, such a thermoelectric module may include an electrode that connects between the p-type thermoelectric element and n-type thermoelectric element.

The module of thermoelectric conversion elements that generates electricity using a temperature difference is used in an environment where a temperature difference between the high temperature part and low temperature part is large, so as to obtain high thermoelectric efficiency. In general, a thermoelectric conversion element using Bi—Te-based thermoelectric material is used at a temperature region of about 200~300° C., and a thermoelectric conversion element using Co—Sb-based thermoelectric material is used at a temperature region of about 500~600° C. As such, since it is used at high temperature, problems occur in terms of heat diffusion of the material of a joining layer, or the oxidation and deformation of a thermoelectric element.

Therefore, there is a demand for the development of novel material having excellent thermal and electrical properties, so that heat diffusion of the material of a joining layer may be prevented, the oxidation and deformation of a thermoelectric element under high temperature environment may be prevented, and a thermoelectric module may be stably operated even at high temperature due to excellent adhesion to a thermoelectric element.

DETAILED DESCRIPTION OF THE INVENTION

Technical Problem

It is an object of the present invention to provide a thermoelectric module in which heat diffusion of the material of a joining layer may be prevented, the oxidation and deformation of a thermoelectric element under high temperature environment may be prevented, and improved operational stability may be exhibited due to excellent adhesion to a thermoelectric element, and a method for manufacturing the same.

Technical Solution

According to one embodiment of the present invention, a thermoelectric module is provided, which comprises:

at least a first and a second thermoelectric element comprising a thermoelectric semiconductor;

an electrode connecting the first and second thermoelectric elements;

at least a first and a second joining layer, the first joining layer positioned between the first thermoelectric element and the electrode, and the second joining layer positioned between the second thermoelectric element and the electrode; and at least a first and a second barrier layer comprising an alloy comprising Cu, Mo and Ti, the first barrier layer positioned between the first thermoelectric element and the first joining layer, and the second barrier layer positioned between the second thermoelectric element and the second joining, layer.

In the thermoelectric module, the Cu—Mo—Ti alloy may comprise Cu in the content of 1 to 50 atom %, based on the total content of metal atoms.

And, the Cu—Mo—Ti alloy may comprise Mo and Ti at an atomic ratio of 1:9 to 9:1.

And, in the thermoelectric module, the thickness of the barrier layer may be 100 nm to 200 μm.

And, in the thermoelectric module, the thermoelectric semiconductor may comprise at least one selected from the group consisting of Bi—Te based, skutterudite based, silicide based, Half heusler based, Co—Sb based, PbTe based, Si based, and SiGe based thermoelectric semiconductors.

And, in the thermoelectric module, the joining layer may comprise a solder.

And, according to another embodiment of the present invention, a method for manufacturing a thermoelectric module is provided, which comprises the steps of: forming a barrier layer comprising Cu—Mo—Ti alloy, on at least one side of a thermoelectric element; and positioning a metal paste for forming a joining layer on the barrier layer, and then, joining it with en electrode.

In the preparation method, the formation of the barrier layer may be conducted by sputtering, deposition, ion plating, plating or sintering.

And, the joining may be conducted by soldering or sintering.

Advantageous Effects

According to the present invention, a thermoelectric module that comprises a barrier layer having excellent thermal, electrical properties, thereby preventing heat diffusion of the material of a joining layer, preventing the oxidation and deformation of a thermoelectric element under high temperature environment, and exhibiting improved operational stability due to excellent adhesion to a thermoelectric element, can be provided.

BRIEF DESCRIPTION OF DRAWINGS

FIG. 1 is a graph observing the coefficients of thermal expansion of the barrier layers of Examples 1, 3, 4 and Comparative Example 1.

DETAILED DESCRIPTION OF THE EMBODIMENTS

The terms used herein are only to explain specific embodiments, and are not intended to limit the present invention. A singular expression includes a plural expression thereof, unless it is expressly stated or obvious from the context that such is not intended. As used herein, the terms "comprise" or "have", etc. are intended to designate the existence of practiced characteristic, number, step, constructional element or combinations thereof, and they are not intended to preclude the possibility of existence or addition of one or more other characteristics, numbers, steps, constructional elements or combinations thereof.

And, in case it is stated that each constructional element is formed "on" or "above" each construction element, it means that each constructional element is formed directly on each constructional element, or that other constructional elements may be additionally formed between the layers or on the object or substrate.

Although various modifications can be made to the present invention and the present invention may have various forms, specific examples will be illustrated and explained in detail below. However, it should be understood that these are not intended to limit the present invention to specific disclosure, and that the present invention includes all the modifications, equivalents or replacements thereof without departing from the spirit and technical scope of the invention.

Hereinafter, a thermoelectric module and a method for preparing the same according to specific embodiments of the invention will be explained in more detail.

In the conventional thermoelectric elements, in order to prevent heat diffusion of the material of a joining layer and the oxidation and deformation of a thermoelectric element under high temperature environment, a barrier layer comprising a metal such as Ag, Al, Cr, Ni, Mo, Pt, Pd, Ti, Ta, W, Zr, V, Nb or In, etc. or an alloy thereof is formed between the thermoelectric element and the joining layer. However, the barrier layer of the prior art had low adhesion to a joining layer, thus rendering stable operation of a thermoelectric module difficult.

Therefore, in the present invention, considering CTE among the various factors influencing the adhesion with a thermoelectric material, using a Cu—Mo—Ti alloy in which Cu with relatively high CTE value is further included in a Mo—Ti alloy having excellent high temperature stability and diffusion preventing property, a barrier layer is formed between the thermoelectric element and joining layer, thereby preventing heat diffusion of the material of a joining layer, preventing the oxidation and deformation of a thermoelectric element under high temperature environment, and exhibiting excellent adhesion to a thermoelectric element, thus improving operational stability of a thermoelectric module.

Namely, the thermoelectric module according to one embodiment of the present invention comprises plural thermoelectric elements comprising thermoelectric semiconductor;

an electrode for connecting between the plural thermoelectric elements; and a joining layer for joining the thermoelectric element and electrode, positioned between each thermoelectric element and electrode, wherein the thermoelectric module further comprises a barrier layer comprising Cu—Mo—Ti alloy, positioned between the thermoelectric element and joining layer.

In the barrier layer, specifically, the Cu—Mo—Ti alloy may comprise Cu in the content of 1 to 50 atom %, based on the total atomic weight of metal atoms in the alloy. If the content of Cu is within the above range, excellent adhesion to a thermoelectric element can be exhibited due to the improvement in CTE, without concerns about deterioration of durability and diffusion preventing property of the barrier layer due to decrease in the relative content of Mo and Ti metals. More specifically, it may comprise Cu in the content of 10 to 50 atom %, more specifically 10 to 25 atom %, or greater than 25 atom % to 50 atom % or less.

And, in the Cu—Mo—Ti alloy, the Mo—Ti alloy exhibits excellent high temperature stability and diffusion preventing property, and specifically, when applied as a barrier layer of Bi—Te-based thermoelectric material, it does not show any change even after durability test at 300° C. for 100 hours, and when applied as a barrier layer of Co—Sb-based thermoelectric material, it does not show any change even after durability test at 500° C. for 72 hours. In the present invention, the Cu—Mo—Ti alloy may comprise Mo and Ti at the atomic ratio of 1:9 to 9:1. If the Mo and Ti are included in the above described atomic ratio in the alloy, diffusion preventing property and durability can be exhibited as well as excellent high temperature stability. More specifically, the alloy may comprise Mo and Ti at the atomic ratio of 5:1 To 3:7, more specifically 4:1 to 1:1.

And, the thickness of the barrier layer comprising Cu—Mo—Ti alloy may be 100 nm to 200 µm. If the thickness of the barrier layer is within the above range, the oxidation of a thermoelectric element can be effectively inhibited, and membrane stress due to a difference in the coefficient of thermal expansion between the thermoelectric material and joining layer can be alleviated to prevent the separation of a membrane. Considering the improvement effect through the controlling of thickness in combination of the use of the alloy material in the barrier layer, the thickness of the barrier layer may be specifically 150 nm to 100 µm, more specifically, 150 nm to 500 nm.

Meanwhile, in the thermoelectric module according to one embodiment of the present invention, the thermoelectric elements are divided into a p-type thermoelectric element and an n-type thermoelectric element according to the function, and one pair of alternating p-n thermoelectric elements becomes a basic unit.

The thermoelectric element comprises thermoelectric semiconductor. The kind of the thermoelectric semiconductor is not specifically limited, and specifically, it may include Bi—Te based, skutterudite based, silicide based, Half heusler based, Co—Sb based, PbTe based, Si based, and SiGe based thermoelectric semiconductors, etc. Among them, Bi—Te-based thermoelectric semiconductor can exhibit more excellent adhesion property because it does not have a significant CTE difference with the above described Cu—Mo—Ti-based alloy.

And in the thermoelectric module according to one embodiment of the present invention, the electrodes are for the connection between the plural thermoelectric elements, specifically, for the electrical series connection between a p-type thermoelectric element and an n-type thermoelectric element, and they are positioned on the upper side and the lower side, respectively, and may comprise conductive material. The conductive material is not specifically limited, and specifically, may it may include Cu, Cu—Mo, Ag, Au or Pt, etc., and a mixture thereof may be used. Among them, the electrode may comprise Cu having high electric conductivity and thermal conductivity.

And, in the thermoelectric module according to one embodiment of the present invention, a joining layer for joining the thermoelectric element and electrode is positioned between each thermoelectric element and electrode.

The joining layer may comprise a solder, specifically, a solider of $Pb_{(1-a)}Sn_a$ ($0<a\leq0.4$) comprising a main components of Pb and Sn, or it may comprise metal powder of Ni, Cu, Fe, Ag or Sn, etc., or intermetallic compounds thereof.

On the joining layer, between the joining layer and thermoelectric element, the above described barrier layer is positioned, and if the joining layer comprises a solder component, a solder joining layer may be further formed so as to improve adhesion between the barrier layer and joining layer. The solider joining layer may comprise metal powder of Ni, Cu, Al, Cr, Fe, Ag, Au or Sn, etc. The thickness of the solider joining layer may be 1 to 200 μm.

The thermoelectric module having the above described structure according to one embodiment of the present invention may be manufactured by a method comprising the steps of: forming a barrier layer comprising Cu—Mo—Ti alloy on at least one side of a thermoelectric element (step 1); positioning a metal paste for the formation of a joining layer on the barrier layer, and then, joining it with an electrode (step 2). Thus, according to another embodiment of the present invention, a method for manufacturing the above described thermoelectric module is provided.

Specifically, the step 1 for the preparation of a thermoelectric module is a step of forming a barrier layer for a thermoelectric element.

The step of forming barrier layer may be conducted by forming an alloy layer of Cu—Mo—Ti on one side or both upper/lower sides of a thermoelectric element by PVD (physical vapor deposition) such as sputtering, evaporation, or ion plating, etc.; plating; or sintering, etc., using Cu, Mo, Ti or an alloy thereof. Among them, ion plating or sputtering may be more preferable because they can closely form a barrier layer on a thermoelectric material with high strength, and are conducted in a closed reaction system such as a vacuum chamber, and thus, there is no concern about deterioration of peel strength.

And, the process conditions of forming a barrier layer may be appropriately controlled so as to fulfill the above explained Cu—Mo—Ti alloy composition and thickness of a barrier layer.

The thermoelectric element is as explained above. However, the thermoelectric element may be pre-treated to control the impurities and oxide film formed on the surface of the barrier layer. Specifically, the pre-treatment may be conducted by surface sputtering using argon ion.

And, in case the thermoelectric module according to the present invention further comprises a solder joining layer between the barrier layer and joining layer, a process of forming a solder joining layer on the barrier layer may be further progressed after forming the barrier layer.

The solder joining layer may be formed by ion plating or sputtering metal powder of Ni, Cu, Al, Cr, Fe, Ag, Au, or Sn, etc. In case the ion plating or sputtering process is used, it may be continuously conducted with the process of forming a barrier layer.

Next, the step 2 for the preparation of a thermoelectric module is a step of joining the thermoelectric element on which a barrier layer is formed with an electrode by the interposition of a joining layer.

Specifically, the formation of the joining layer for joining the thermoelectric element and electrode may be conducted by applying a metal paste for the formation of a joining layer on the barrier layer, positioning an electrode thereon, and then, soldering or sintering. More specifically, it may be formed by a soldering method wherein metal is molten to join using a solder paste such as Sn-based solider paste or Pb-based solider paste, etc., or it may be formed by positioning a metal paste for the formation of a joining layer that is prepared by mixing one or more metal powders of Ni, Cu, Fe, Ag, or Sn, etc., selectively with a binder, a dispersant and a solvent, between the thermoelectric element and electrode, and sintering.

Since the thermoelectric module manufactured according to the above process comprises a barrier layer having excellent thermal and electrical properties, heat diffusion of the material of the joining layer may be prevented, the oxidation and deformation of the thermoelectric module under high temperature environment may be prevented, and improved operational stability may be exhibited due to excellent adhesion to the thermoelectric element. Thus, it can be applied for thermoelectric cooling system or thermoelectric generation system, etc. in various fields and uses.

The present invention will be explained in more detail in the following Examples. However, these examples are presented only as the illustrations of the present invention, and the scope of the present invention is not limited thereby.

EXAMPLE 1

On a thermoelectric element comprising Bi—Ti-based thermoelectric semiconductor, a barrier layer of Cu—Mo—Ti alloy was deposited through sputtering (the thickness of the barrier layer: 350 nm, the composition of the Cu—Mo—Ti alloy: Cu 12.5 atom %, Mo 70 atom %, Ti 17.5 atom %).

The thermoelectric element on which a barrier layer is formed was cut to a size of 3×3 $mm^2$ to prepare a die, which was then lead bonded to Au plated Cu substrate, thus manufacturing a thermoelectric module.

Here, the size of the high temperature substrate of the manufactured thermoelectric module was 30*30 mm, and the size of the low temperature substrate was 30*32 mm, the size of the element was 3*3*2 mm and the thermoelectric module included 32 pairs of the elements.

EXAMPLE 2

A thermoelectric module was manufactured by the same method as Example 1, except that the thickness of the barrier layer was changed to 160 nm in Example 1.

EXAMPLE 3

A thermoelectric module was manufactured by the same method as Example 2, except that a barrier layer was formed using Cu—Mo—Ti alloy comprising 25 atom % of Cu, 43 atom % of Mo and 32 atom % of Ti instead of the Cu—Mo—Ti alloy of Example 2.

EXAMPLE 4

A thermoelectric module was manufactured by the same method as Example 2, except that a barrier layer was formed using Cu—Mo—Ti alloy comprising 50 atom % of Cu, 33.3 atom % of Mo and 16.7 atom % of Ti instead of the Cu—Mo—Ti alloy of Example 2.

COMPARATIVE EXAMPLE 1

A thermoelectric module having a barrier layer comprising Mo—Ti alloy (the thickness of the barrier layer: 160 nm) was manufactured by the same method as Example 1, except that a barrier layer was formed using Mo—Ti alloy (55 atom % of Mo and 45 atom % of Ti) instead of the Cu—Mo—Ti alloy of Example 1.

EXPERIMENTAL EXAMPLE 1

For the evaluation of adhesion, DSS (Die shear strength) evaluation was progressed.

The Bi—Ti-based thermoelectric materials of Examples 1 and 2 on which a barrier layer is formed was cut to a size of 3×3 mm$^2$ to prepare each die, which was then lead bonded to Au plated Cu substrate, thus preparing a sample. Here, for the comparison, the Bi—Ti-based thermoelectric material of Comparative Example 1 on which a Mo—Ti barrier layer is formed was used.

The DSS measurement was conducted by fixing a substrate on a substrate holder, and then, fixing a tip at a 100 μm position from the substrate, and measuring a force pushed by the tip when the tip is dropped on the substrate while pushing the die. The results are shown in the following Table 1.

TABLE 1

|  | Example 1 | Example 2 | Comparative Example 1 |
|---|---|---|---|
| Adhesion | 10.4 MPa | 11.6 MPa | 5.6 MPa |

As the results of experiment, Examples 1 and 2 comprising a barrier layer of Cu—Mo—Ti alloy including Cu exhibited excellent adhesion, and particularly, Example 2 exhibited remarkably increased adhesion compared to Comparative Example 1 wherein the thickness of the barrier layer is identical to Example 2, but the barrier layer comprises Mo—Ti alloy instead of Cu—Mo—Ti alloy.

EXPERIMENTAL EXAMPLE 2

Using Examples 1, 3, 4 and Comparative Example 1, a change in the coefficient of thermal expansion (CTE) according to Cu content in the Mo—Ti alloy was observed. The results were shown in FIG. 1.

As shown in FIG. 1, Examples 1, 3 and 4 comprising a barrier layer further comprising Cu in the Mo—Ti alloy exhibited high CTE, compared to Comparative Example 1, and as the content of Cu included in the Mo—Ti alloy increases, CTE tended to significantly increase. From the results, it can be seen that adhesion of a barrier layer to a thermoelectric element can be further improved through the addition of Cu and the optimization of the content.

The invention claimed is:

1. A thermoelectric module comprising:
at least a first and a second thermoelectric element comprising a thermoelectric semiconductor;
an electrode connecting the first and second thermoelectric elements;
at least a first and a second joining layer, the first joining layer positioned between the first thermoelectric element and the electrode, and the second joining layer positioned between the second thermoelectric element and the electrode; and
at least a first and a second barrier layer comprising an alloy comprising Cu, Mo and Ti, the first barrier layer positioned between the first thermoelectric element and the first joining layer, and the second barrier layer positioned between the second thermoelectric element and the second joining layer;
wherein the thermoelectric element comprises a Bi—Te based thermoelectric semiconductor; and
wherein the alloy comprises Cu in a content of 10 to 50 atom %, based on a total content of metal atoms and comprises Mo and Ti at an atomic ratio of 4:1 to 1:1.

2. The thermoelectric module according to claim 1, wherein a thickness of the barrier layer is 100 nm to 200 μm.

3. The thermoelectric module according to claim 1, wherein the first and second joining layer comprise a solder.

4. A method for manufacturing a thermoelectric module according to claim 1 comprising the steps of:
forming a barrier layer comprising an alloy comprising Cu, Mo and Ti, on at least one side of a thermoelectric element; and
positioning a metal paste for forming a joining layer on the barrier layer, and then, joining the thermoelectric element having the barrier layer and joining layer formed thereon with an electrode, wherein joining layer faces the electrode.

5. The method for manufacturing a thermoelectric module according to claim 4, wherein the formation of the barrier layer is conducted by sputtering, deposition, ion plating, plating or sintering.

6. The method for manufacturing a thermoelectric module according to claim 4, wherein the joining is conducted by soldering or sintering.

* * * * *